United States Patent
Paton et al.

(10) Patent No.: US 6,787,864 B2
(45) Date of Patent: Sep. 7, 2004

(54) MOSFETS INCORPORATING NICKEL GERMANOSILICIDED GATE AND METHODS FOR THEIR FORMATION

(75) Inventors: Eric N. Paton, Morgan Hill, CA (US); Qi Xiang, San Jose, CA (US); Paul R. Besser, Sunnyvale, CA (US); Ming-Ren Lin, Cupertino, CA (US); Minh V. Ngo, Fremont, CA (US); Haihong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/335,492

(22) Filed: Dec. 31, 2002

(65) Prior Publication Data

US 2004/0061191 A1 Apr. 1, 2004

Related U.S. Application Data

(60) Provisional application No. 60/415,179, filed on Sep. 30, 2002.

(51) Int. Cl.$^7$ .............................................. H01L 29/72
(52) U.S. Cl. ..................... 257/412; 257/192; 257/295; 257/296; 438/197; 438/649; 438/655; 438/656; 438/657
(58) Field of Search ................................ 257/412, 192, 257/295, 296; 438/197, 649, 655, 656, 657

(56) References Cited

U.S. PATENT DOCUMENTS

| | | | |
|---|---|---|---|
| 6,406,973 B1 | 6/2002 | Lee | |
| 6,506,637 B2 * | 1/2003 | Maa et al. | 257/412 |
| 2002/0125497 A1 | 9/2002 | Fitzgerald | |
| 2002/0130393 A1 | 9/2002 | Takayanagi et al. | |
| 2002/0134982 A1 | 9/2002 | Maa et al. | |
| 2003/0057439 A1 * | 3/2003 | Fitzgerald | 257/412 |

OTHER PUBLICATIONS

Ku J–H et al: High Performance PMOSFETS with Ni (Sixge 1–X) / Poly–Sio.8geo.2 Gate 2000 Symposium on VLSI Technology. Digest of Technology Papers. Honolulu, Jun. 13–15, 2000, Symposium on VLSI Technology, New York, NY: IEEE, US, Jun. 13, 2000, pp. 114–115.

Seungheon Song et al: "High Performance Transistors with State–of–the–Art CMOS Technologies" Electron Devices Meeting, 1999. IEDM Technical Deigest. International Washington, DC, USA Dec. 5–8, 1999, Piscataway, NJ, USA, IEEE, US, Dec. 5, 1999, pp. 427–430.

Thompson R D et al: "Interfacial Reaction Between Ni and MBE–Grown Sige Alloy" Journal of the Electrochemical Society, Electrochemical Society. Manchester, New Hampshire, US, vol. 135, No. 12, Dec. 1, 1988, pp. 3161–3163.

* cited by examiner

*Primary Examiner*—Edward Wojciechowicz
(74) *Attorney, Agent, or Firm*—Foley & Lardner LLP

(57) ABSTRACT

A MOSFET gate or a MOSFET source or drain region comprises silicon germanium or polycrystalline silicon germanium. Silicidation with nickel is performed to form a nickel germanosilicide that preferably comprises the monosilicide phase of nickel silicide. The inclusion of germanium in the silicide provides a wider temperature range within which the monosilicide phase may be formed, while essentially preserving the superior sheet resistance exhibited by nickel monosilicide. As a result, the nickel germanosilicide is capable of withstanding greater temperatures during subsequent processing than nickel monosilicide, yet provides approximately the same sheet resistance and other beneficial properties as nickel monosilicide.

21 Claims, 6 Drawing Sheets

MOSFETS INCORPORATING NICKEL GERMANOSILICIDED GATE AND METHODS FOR THEIR FORMATION

RELATED APPLICATIONS

This application claims priority under 35 U.S.C. §119(e) from U.S. Provisional Patent Application Serial No. 60/415,179, filed Sep. 30, 2002.

BACKGROUND OF THE INVENTION

1. Field of the Invention

The invention pertains to metal oxide semiconductor field effect transistors (MOSFETs), and more particularly to silicon metal compounds used for forming contacts to MOSFET source and drain regions and gate electrodes.

2. Related Technology

Metal oxide semiconductor field effect transistors (MOSFET) are the primary component of most semiconductor devices. FIG. 1 shows a MOSFET formed in accordance with conventional technology. The MOSFET includes a semiconductor substrate 10 in which are formed deep source and drain regions 12 and shallow source and drain extensions 14. A polysilicon gate 16 overlies a gate oxide 18 and is protected by spacers 20 formed on its sidewalls. The source and drain regions 12 are coupled to conductive contacts 22 that are inlaid in a protective layer 24 such as borophosphosilicate glass (BPSG).

The conventional MOSFET utilizes silicide regions 26 to facilitate the formation of ohmic contacts having low contact resistance with the source and drain regions 12. A silicide region 28 is also formed on the gate 16 to form a structure conventionally referred to as a polycide gate. Conventionally, a refractory metal such as titanium, tungsten, tantalum or molybdenum was used for forming gate and source/drain silicides. More recently cobalt has been adopted as the preferred metal for silicide formation. The silicide regions serve as an interface that reduces the contact resistance between the underlying silicon and other materials such as aluminum that are traditionally used as a first level of connection for sources, drains and gates.

Silicide regions such as those shown in FIG. 1 are typically made though a self-alignment process and are therefore sometimes referred to as "salicides" (Self Aligned siLICIDEs). In the salicide process, the gate and gate oxide are patterned together in a self-aligned fashion using a single hardmask, a low energy dopant implantation is performed to form the shallow source and drain extensions, the spacers are then formed on sidewalls of the gate and gate oxide, high energy dopant implantation is performed to form deep source and drain regions, and then a conformal layer of a metal is formed over the entire structure. Thermal treatment is then performed to promote formation of a silicide compound comprising the metal and the silicon of the source and drain regions and the polysilicon of the gate. After performing thermal treatment for a time sufficient to produce a desired thickness of silicide, the remaining metal is removed, leaving silicide regions as shown in FIG. 1.

Demands for increased device speed and performance have driven a continuous search for ways to reduce the size and increase the operating speed of MOSFETs. At the same time, further research has been directed toward identifying new materials that may be substituted for conventional materials to provide advantages such as greater ease of miniaturization and simplified process integration.

One material that is being considered as a replacement for the conventional refractory contact metals is nickel (Ni). Nickel forms three phases of nickel silicide: metal-rich di-nickel suicide ($Ni_2Si$), nickel monosilicide (NiSi), and silicon-rich nickel di-silicide ($NiSi_2$). Nickel monosilicide is particularly preferred, as it has a low resistivity comparable to that of titanium, but consumes less silicon during silicide formation and therefore lends itself to silicidation of very thin active regions. Nickel monosilicide sheet resistance also has no adverse line-width dependence, which is often a problem with the traditional refractory suicides. Nickel monosilicide sheet resistance has even been found to decrease in narrow lines because of an edge effect that is specific to nickel monosilicide. The mechanical stress of nickel monosilicide on a silicon substrate is less than that of titanium. In addition, contact resistance to p-type silicon is lower than that of titanium silicide, and is also low for n-type silicon. Nickel monosilicide also exhibits good adhesion to silicon. Therefore nickel monosilicide presents a desirable substitute for conventional refractory contact metals in MOSFETs with ultra-shallow source and drain diffusions.

One drawback of nickel monosilicide is that its thermal stability is relatively poor at temperatures typically encountered during MOSFET fabrication. FIG. 2 shows a graph relating the sheet resistance of the three phases of nickel silicide compounds with their formation temperatures. As seen in FIG. 2, nickel monosilicide is best formed between 300–600 degrees C., and when formed in that temperature range it provides a sheet resistance of less than three ohms per square. In contrast, the metal-rich di-nickel silicide and the silicon-rich nickel disilicide are formed at temperatures outside of this range, and each produces a significant increase in sheet resistance. As a result, the high process temperatures typically used in semiconductor processing for purposes such as source/drain implant anneals can promote the conversion of nickel monosilicide into nickel disilicide, and thereby increase the sheet resistance of the silicide. Therefore a design that uses nickel monosilicide is restricted in the thermal budget that is available for further processing.

Consequently, the current technology does not provide a manner of exploiting the beneficial features of nickel monosilicide without significantly restricting the thermal budget available for subsequent processing.

SUMMARY OF THE INVENTION

In light of the advantages and disadvantages of nickel monosilicide as explained above, it is an object of the invention to harness the advantages of nickel as a contact metal in MOSFET source/drain and gate silicides while relaxing the thermal budget restrictions inherent in the known nickel monosilicide processes.

In accordance with an embodiment of the invention, the gate of a MOSFET is capped with a layer of polycrystalline polycrystalline silicon germanium. Silicidation with nickel is then performed to form a nickel-germanosilicide that preferably comprises the monosilicide phase of nickel silicide. The source and drain regions may also employ nickel germanosilicide. The incorporation of germanium in the silicide provides a wider temperature range within which the monosilicide may be formed, while essentially preserving the sheet resistance exhibited by nickel monosilicide. As a result, the nickel germanosilicide is capable of withstanding greater temperatures during subsequent processing than nickel monosilicide, yet provides approximately the same sheet resistance and other beneficial properties as nickel monosilicide.

In accordance with one embodiment of the invention, a MOSFET is manufactured from a semiconductor substrate having formed thereon a gate insulating layer, a polysilicon layer formed on the gate insulating layer, and a polycrystalline silicon germanium layer formed on the polysilicon layer. The polycrystalline silicon germanium layer, the polysilicon layer and the gate insulating layer are patterned to form a gate insulator and a gate overlying the gate insulator, the gate comprising a lower polysilicon portion and an upper polycrystalline silicon germanium portion. A layer of nickel is then formed over at least the upper polycrystalline silicon germanium portion of the gate, and thermal treatment is performed to form a nickel germanosilicide on the gate.

In accordance with another embodiment of the invention, a MOSFET includes source and drain regions, a channel region extending between the source and drain regions, a gate insulator overlying the channel region, and a polycide gate overlying the gate insulator. The polycide gate has a lower polysilicon portion and an upper polycrystalline silicon germanium portion, and a nickel germanosilicide formed on the upper polycrystalline silicon germanium portion. Alternatively, at least one of the polycide gate and the source and drain regions comprises nickel germanosilicide.

DESCRIPTION OF THE DRAWINGS

Embodiments of the invention are described in conjunction with the following drawings, in which.

DETAILED DESCRIPTION OF PREFERRED EMBODIMENTS

Figure 1:
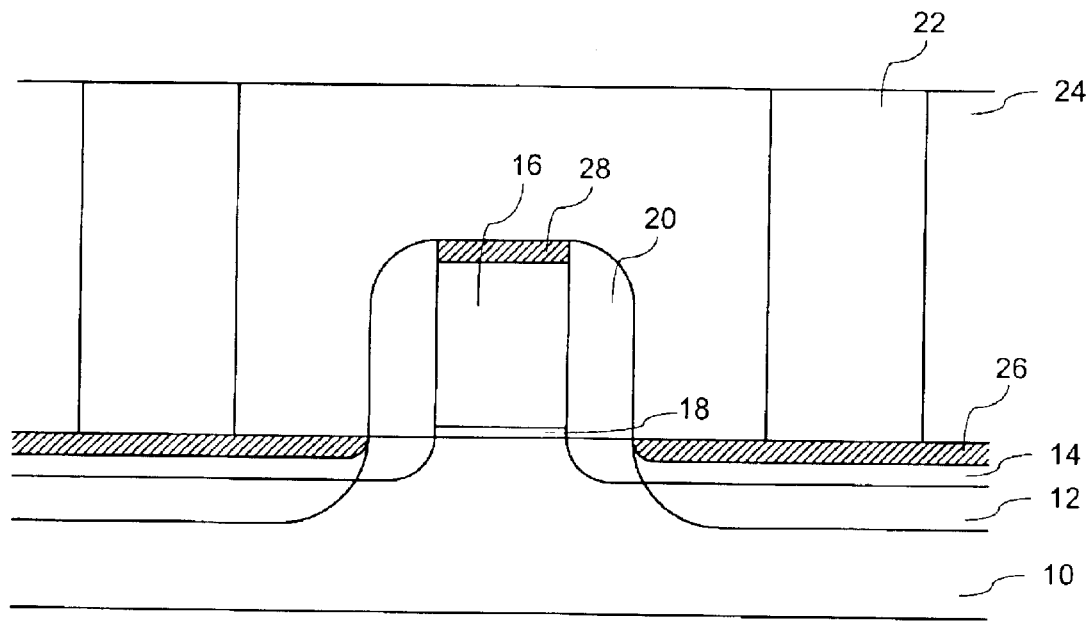
FIG. 1 shows a cross-section of a conventional MOSFET employing a conventional polysilicon gate structure.
Figure 2:
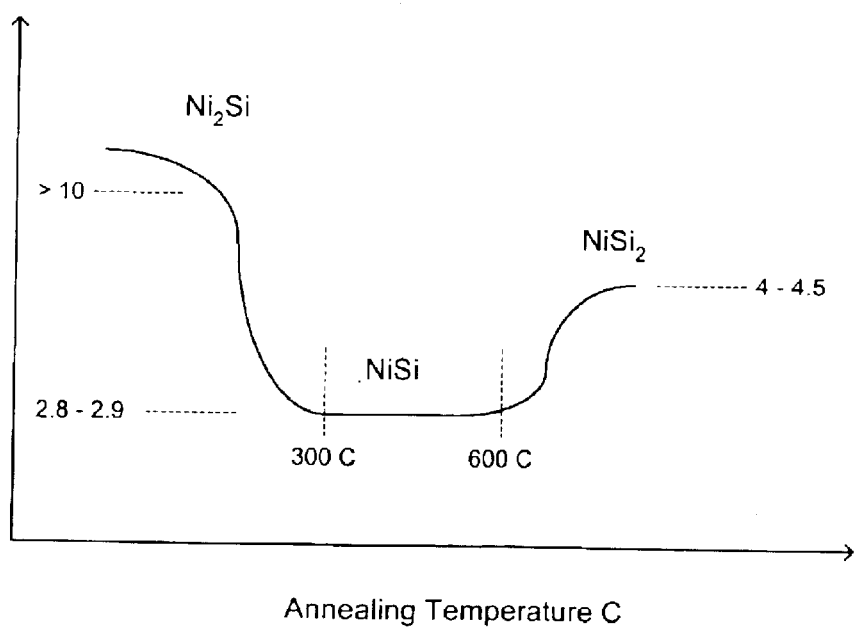
FIG. 2 shows a graph relating the sheet resistance of nickel silicide to the thermal processing temperature used for its formation.
Figure 3:
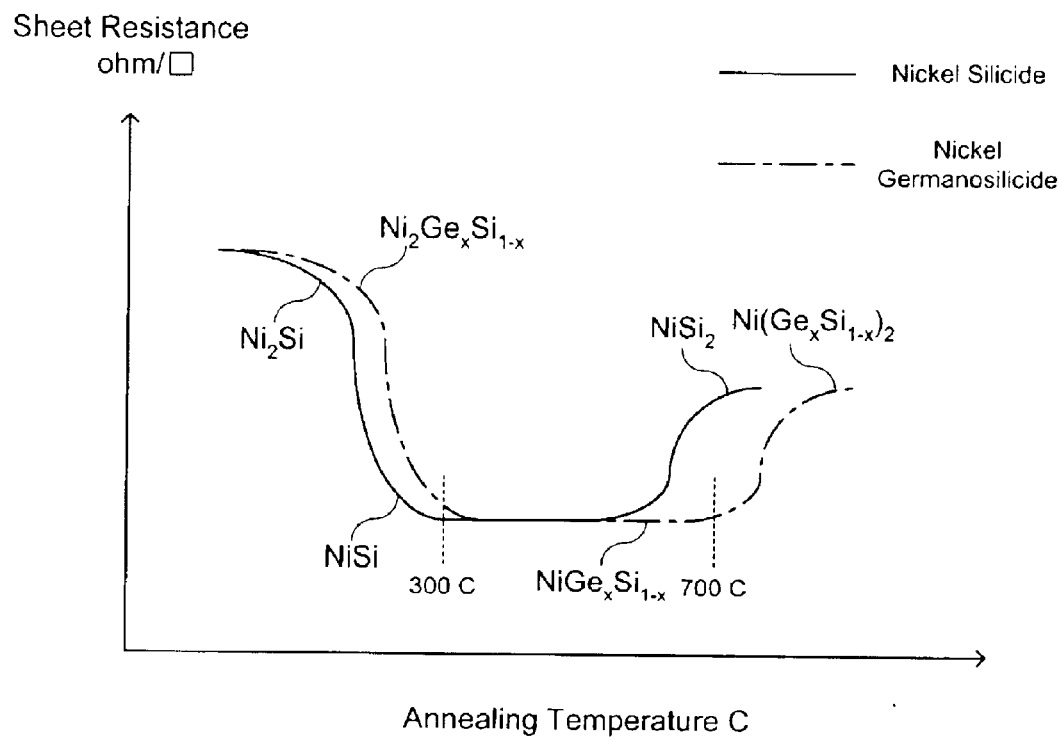
FIG. 3 shows a graph relating the sheet resistances of nickel silicide and nickel germanosilicide to the thermal processing temperatures used for their formation.

FIG. 3 shows a graph relating the sheet resistances of nickel suicides and nickel germanosilicides to their formation temperatures. The graph of FIG. 3 assumes a germanium/silicon composition $Si_{1-x}Ge_x$, where x is 0.1–0.4. As seen in FIG. 3, the contours of the graph are similar for nickel silicides and nickel germanosilicides, varying between three to ten ohms per square, however the formation temperature range for the silicon-rich phase of nickel germanosilicide is higher than that of the silicon-rich phase of nickel silicide. The ideal range for formation of the monosilicide phase of nickel germanosilicide lies in the range of approximately 300 degrees C. to 700 degrees C. As a result, this enables the nickel germanosilicide to withstand higher processing temperatures without significant degradation of the monosilicide phase.

Accordingly, a first preferred embodiment employs a nickel germanosilicide as a gate contact layer of a MOSFET. Structures formed during fabrication of such a device are illustrated in FIGS. 4a–4f.

Figure 4A:
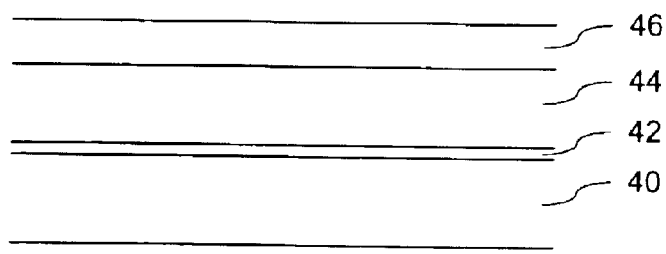
FIGS. 4a, 4b, 4c, 4d, 4e and 4f show structures formed during fabrication of a MOFET in accordance with a first preferred embodiment of the invention.

FIG. 4a shows a structure from which the MOSFET of the first preferred embodiment is formed. The structure includes a silicon semiconductor substrate 40 on which is formed a gate insulating layer 42 such as silicon oxide, a polysilicon gate conducting layer 44, and a polycrystalline silicon germanium layer 46. The polycrystalline silicon germanium layer 46 preferably has a composition $Si_{1-x}Ge_x$, where x is typically in the range of 0.1 to 0.3, and is preferably approximately 0.2 The gate oxide layer 42 is preferably 10–30 Angstroms thick, the polysilicon gate conducting layer 44 is preferably 500–1000 Angstroms thick, and the silicon germanium layer 46 is preferably 300–600 Angstroms thick. Processes for forming the gate oxide and polysilicon layers are well known. The polycrystalline silicon germanium layer may be formed by chemical vapor deposition using $Si_2H_6$ (disilane) and $GeH_4$ (germane) as source gasses at a temperature of 600–900 degrees C., with a disilane partial pressure of 30 mPa, and a germane partial pressure of 60 mPa. Growth of the polycrystalline silicon germanium material may be initiated using these rations, or alternatively the partial pressure of germane may be gradually increased beginning from a lower pressure or zero pressure to form a gradient composition. The polysilicon 44 and polycrystalline silicon germanium 46 layers may be formed in distinct processing steps, however it is preferable to form the layers in situ in a continuous process in which the portion of germanium source gas is gradually introduced so as to form a graded layer. It is noted that polycrystalline silicon germanium can be deposited at lower temperatures than are required for the deposition of polysilicon, and so temperature control may be implemented along with source gas control when forming a graded structure.

Figure 4B:
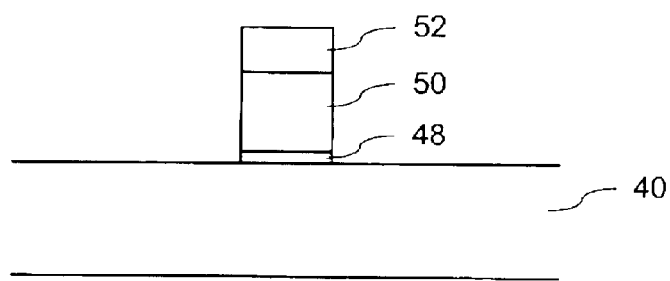

FIG. 4b shows the structure of FIG. 4a after patterning of the gate insulating layer, gate conducting layer and polycrystalline silicon germanium layer to form a self-aligned gate stack including an oxide gate insulator 48 and a gate comprising a lower polysilicon portion 50 and an upper polycrystalline silicon germanium portion 52.

Figure 4C:
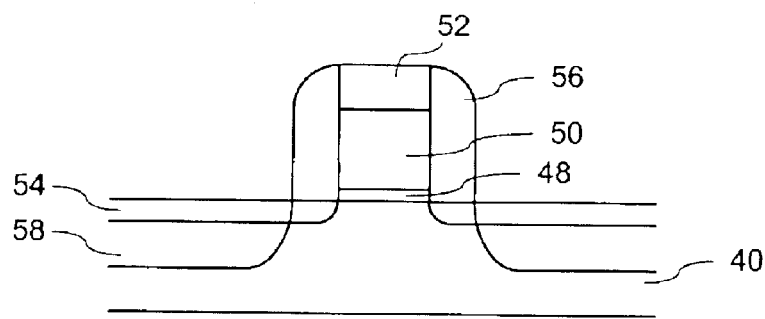

FIG. 4c shows the structure of FIG. 4b after source and drain implantation and formation of gate spacers. To produce the structure of FIG. 4c, low energy dopant implantation is performed on the structure of FIG. 4b to form shallow source and drain extensions 54. Gate spacers 56 are then formed by depositing a conformal layer of a protective material such as silicon oxide, followed by anisotropic etching to remove deposited material from the top of the gate and from the substrate surface. Next, high energy dopant implantation is performed to form deep source and drain regions 58. During high energy implantation the gate spacers 56 serve as an implant mask that protects the underlying shallow source and drain extensions.

Figure 4D:
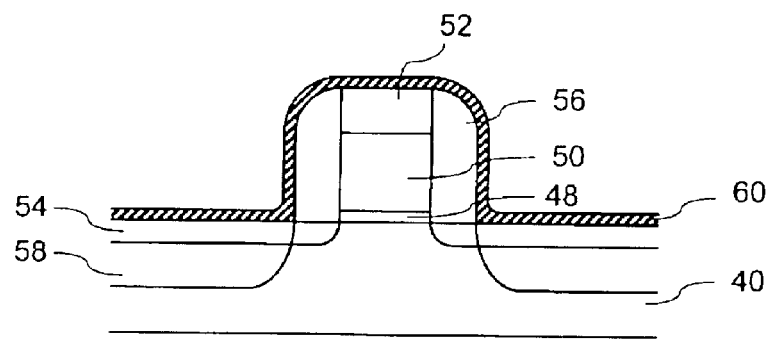

FIG. 4d shows the structure of FIG. 4c after formation of a conformal layer of nickel 60 over the substrate and gate stack, including the exposed surfaces of the source and drain regions 58 and the exposed surface of the gate stack. The nickel layer is preferable formed by physical vapor deposition (sputtering), but other well-known methods of metal layer formation may also be utilized.

Figure 4E:
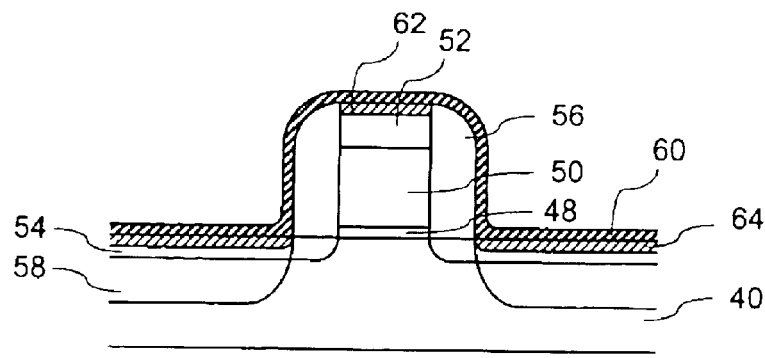
Figure 4F:
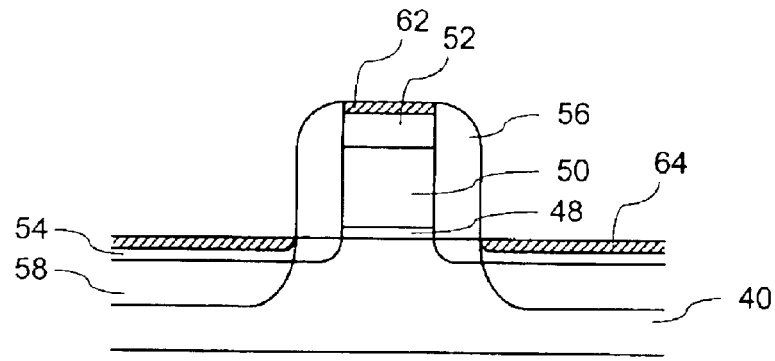

FIG. 4e shows the structure of FIG. 4d after performing thermal processing on the structure of FIG. 4d to promote formation of silicides between the nickel layer 60 and the silicon of the source and drain regions and the polycrystalline silicon germanium of the upper portion 52 of the gate. Thermal processing is preferably performed using a temperature range of 350–700 degrees C. so as to form nickel germanosilicide containing primarily the monosilicide phase. Because the silicide formation process consumes silicon, the thickness of the nickel germanosilicide layer is determined by the amount of time that thermal is performed. The resulting structure includes a nickel germanosilicide region 62 formed on the upper polycrystalline silicon germanium portion 52 of the gate, and nickel silicide regions 64 formed at the surfaces of the source and drain regions 56.

While the processing described with respect to FIGS. 4a–4f represents a preferred manner of fabricating one type of MOSFET including a nickel germanosilicide gate, other manners of processing may be employed to realize the same structure or other MOSFET structures having a nickel germanosilicide gate. For example, while the preferred embodiment employs the technique of deposition of a layer of nickel followed by thermal processing, alternative methods may be employed to form a layer of nickel germanosilicide, such as simultaneous evaporation of nickel, silicon and germanium, or co-sputtering of nickel, silicon and germanium, or sputtering from a nickel silicon germanium target. It should be appreciated that such alternative methods may require masking, etching and removal processing that are different from the processing of FIGS. 4a–4f, and that may be tailored to the particular implementation in order to form nickel germanosilicide regions at appropriate locations of the MOSFET.

Figure 5:
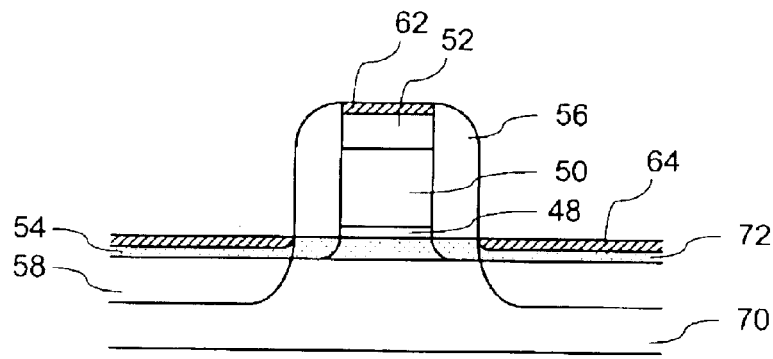
FIG. 5 shows a MOSFET fabricated in accordance with a second preferred embodiment of the invention.

A structure in accordance with a second preferred embodiment of the invention is illustrated in FIG. 5. The structure of FIG. 5 differs from that of FIG. 4f in that the substrate includes a layer of silicon germanium 70 on which is formed a thin layer of "strained" silicon 72. Strained silicon is a form of silicon in which a tensile strain is applied to the silicon lattice as a result of the difference in the dimensionalities of the silicon lattice and the lattice of the underlying material on which it is formed. In the illustrated case, the silicon germanium lattice is more widely spaced than a pure silicon lattice, with the spacing becoming wider as the percentage of germanium increases. Because the silicon lattice aligns with the larger silicon germanium lattice during formation, a tensile strain is imparted to the silicon layer. In essence, the silicon atoms are pulled apart from one another. Relaxed silicon has a conductive band that contains six equal valence bands. The application of tensile strain to the silicon causes four of the six valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons meet with less vibrational energy from the nucleus of the silicon atom, which causes them to scatter at a rate of 500 to 1000 times less than in relaxed silicon. Consequently, carrier mobility is dramatically increased in strained silicon compared to relaxed silicon, providing a potential increase in mobility of 80% or more for electrons and 20% or more for holes. The increase in mobility has been found to persist for current fields up to 1.5 megavolts/centimeter. These factors are believed to enable a device speed increase of 35% without further reduction of device size, or a 25% reduction in power consumption without a reduction in performance.

Accordingly, the structure of FIG. 5 exploits the beneficial features of strained silicon by utilizing an epitaxial layer of strained silicon 72 supported by a silicon germanium layer 70. The source and drain regions 58 and the channel region are formed in the strained silicon 72. Therefore, the structure of FIG. 5 is formed in a manner similar to that shown in FIGS. 4a–4f, with the distinction that the initial layered structure shown in FIG. 4a is altered so as to have a silicon germanium layer and a strained silicon layer between the semiconductor substrate 40 and the gate insulating layer 42. The silicon germanium layer 70 preferably has a composition $Si_{1-x}Ge_x$, where x is approximately 0.2, and is more generally in the range of 0.1 to 0.3. Silicon germanium may be grown on a silicon wafer substrate, for example, by chemical vapor deposition using $Si_2H_6$ (disilane) and $GeH_4$ (germane) as source gases, with a substrate temperature of 600 to 900 degrees C., a $Si_2H_6$ partial pressure of 30 mPa, and a $GeH_4$ partial pressure of 60 mPa. Growth of the silicon germanium material may be initiated using these ratios, or alternatively the partial pressure of $GeH_4$ may be gradually increased beginning from a lower pressure or zero pressure to form a gradient composition. The strained silicon layer may then be grown on the silicon germanium layer, for example by chemical vapor deposition (CVD) using $Si_2H_6$ as a source gas with a partial pressure of 30 mPa and a substrate temperature of approximately 600–900 degrees C.

Figure 6:
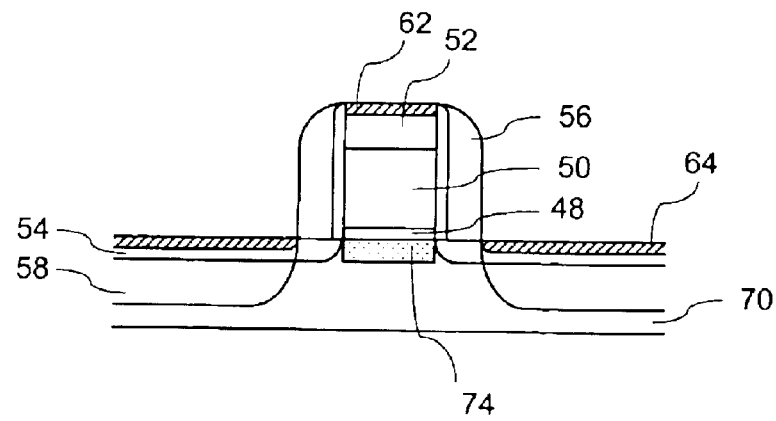
FIG. 6 shows a MOSFET fabricated in accordance with a third preferred embodiment of the invention.

FIG. 6 shows a structure in accordance with a third preferred embodiment. The structure of FIG. 6 is similar to that of FIG. 5 in that it employs strained silicon formed over a silicon germanium lattice. However, the strained silicon of the structure of FIG. 6 is limited to a channel region 74 under the gate insulator 48 and spacer 56. Such a structure may be formed by etching an epitaxial strained silicon layer replacement of the etched strained silicon with silicon germanium prior to formation of the spacer 56 and implantation of the deep source and drain regions 58. Alternatively the strained silicon channel region 74 may be formed in an inlaid manner prior to formation of the gate insulating layer and overlying layers. An advantage of structures having silicon germanium source and drain regions such as the structure of FIG. 6 is that the advantages of strained silicon are incorporated into the device while also incorporating the benefits of nickel germanosilicide in the source and drain regions. In addition, such an embodiment may be particularly desirable for providing precise control of source and drain geometry in PMOS implementations because of the reduced diffusion of boron (B) dopant in silicon germanium.

Figure 7:
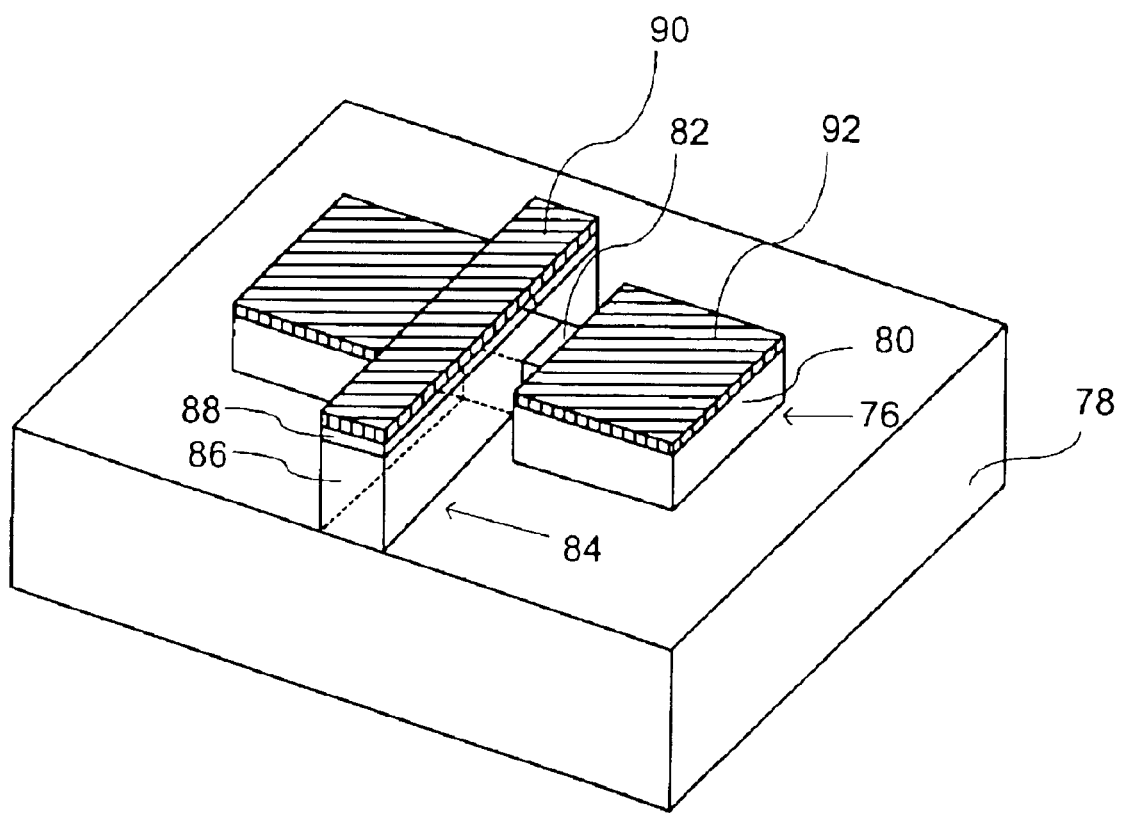
FIG. 7 shows a MOSFET fabricated in accordance with a fourth preferred embodiment of the invention.

FIG. 7 shows a structure in accordance with a fourth preferred embodiment of the invention. The structure of FIG. 7 is a silicon on insulator (SOI) structure typically referred to as a vertical double gate MOSFET or FinFET. The structure comprises a monolithic semiconductor body 76 formed on an insulating substrate 78. The semiconductor body includes source and drain regions 80 and a channel region 82 extending between the source and drain regions. A gate 84 is formed over and around the channel region 82 and is separated from the channel region by a gate insulator (not shown) and protected from the source and drain regions by dielectric spacers (not shown). In accordance with the invention, the gate includes a lower polysilicon portion 86 and an upper polycrystalline silicon germanium portion 88 on which is formed a nickel germanosilicide 90. Nickel suicides 92 may also be formed on the source and drain regions. In one embodiment, the semiconductor body 76 is formed of silicon. In an alternative embodiment, the semiconductor body 76 may be formed of silicon germanium and capped with a layer of strained silicon. In another alternative embodiment, the semiconductor body 76 may be formed of silicon germanium and capped with a layer of strained silicon in only the channel region, thus enabling the formation of nickel germanosilicide on the source and drain regions 80.

While the MOSFET structures of FIGS. 4f, 5, 6 and 7 represent the presently preferred embodiments, nickel germanosilicides have equal application to other types of MOSFET structures. For example, other constructions such as inverted or bottom gate MOSFETS, in which the gate underlies the channel region, may also utilize nickel germanosilicide for providing low contact resistance to source and drain regions and to gates. Such alternative constructions may incorporate strained silicon in the channel regions and in the source and drain regions. As in the preferred embodiments described above, it is preferable that the nickel germanosilicide is comprised as much as possible by the nickel monosilicide phase.

It should therefore be understood that embodiments within the scope of the invention include a variety of MOSFET structures, each of which is characterized by the use of nickel germanosilicide as a silicide on a gate or in a source or drain region.

Figure 8:
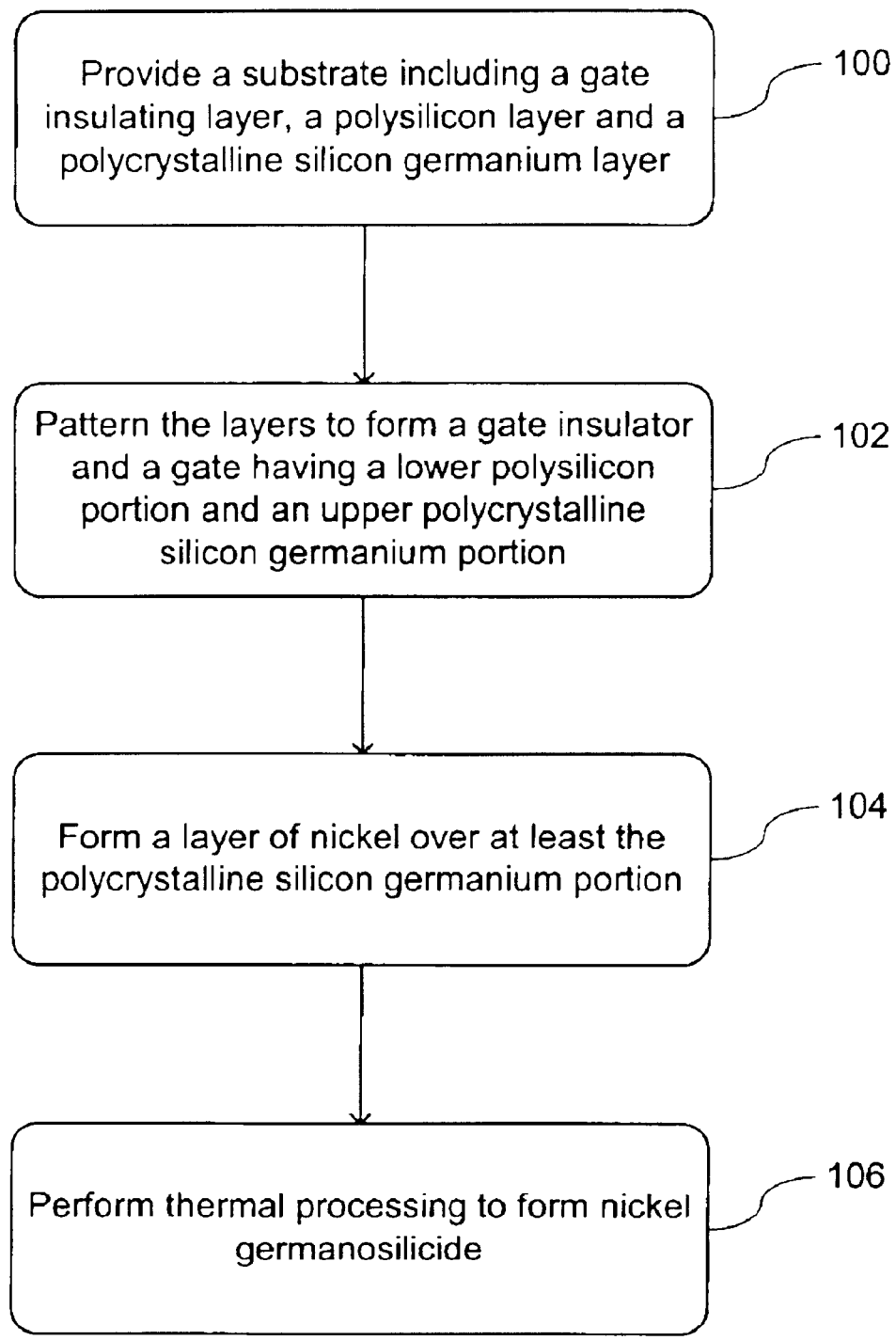
FIG. 8 shows a process flow for manufacturing devices in accordance with the preferred embodiments and alternative embodiments.

FIG. 8 shows a process flow for manufacture of a MOSFET encompassing the aforementioned preferred embodiments and alternatives as well as additional alternative embodiments not expressly described herein. Initially a semiconductor substrate is provided (100). The substrate has formed thereon a gate insulating layer, a polysilicon layer formed on the gate insulating layer, and a polycrystalline silicon germanium layer formed on the polysilicon layer. The polycrystalline silicon germanium layer, the polysilicon layer and the gate insulating layer are then patterned to form a gate insulator and a gate overlying the gate insulator (102). The gate thus includes a lower polysilicon portion and an upper polycrystalline silicon germanium portion. A layer of nickel is formed over at least the upper polycrystalline silicon germanium portion of the gate (104). Thermal treatment is then performed to form a nickel germanosilicide on the gate (106). It is noted that the substrate referred to herein may comprise a semiconductor substrate, as used in the embodiments of FIGS. 4f, 5 and 6, or an insulating substrate having a semiconductor body previously patterned thereon, as used in the embodiment of FIG. 8.

In further embodiments it may be desirable to perform additional types of processing or to form different types of structures. For example it may be preferable to alloy the nickel layer with another metal such as vanadium (Va), tantalum (Ta) or tungsten (W) to improve the phase stability of the germanosilicide. The additional metal may be implanted into the nickel layer or may be formed as a separate CVD or PVD layer over the nickel layer prior to germanosilicide formation. In other embodiments a polycrystalline silicon germanium gate may be employed. In further embodiments, the polycrystalline silicon germanium portion of the gate may be formed by annealing a polysilicon gate in a germanium atmosphere or by implanting germanium into a polysilicon gate. In other embodiments, it may be desirable to perform a reduction in a hydrogen atmosphere to remove oxide prior to deposition of the nickel layer.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counterdoping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A process for forming a metal oxide semiconductor field effect transistor (MOSFET), comprising:

providing a semiconductor substrate having formed thereon a gate insulating layer, a polysilicon layer formed on the gate insulating layer, and a polycrystalline silicon germanium layer formed on the polysilicon layer, the substrate comprising a surface layer of strained silicon overlying a layer of silicon germanium;

patterning the polycrystalline silicon germanium layer and the polysilicon layer to form a gate overlying the gate insulating layer, the gate comprising a lower polysilicon portion and an upper polycrystalline silicon germanium portion;

removing the strained silicon layer from source and drain regions of the MOSFET to form a strained silicon channel region of the MOSFET, forming a layer of nickel in contact with the upper polycrystalline silicon germanium portion of the gate and in contact with the silicon germanium layer in the source and drain regions; and performing thermal treatment to form a-nickel germanosilicide contacts on the gate and on the silicon germanium source and drain regions.

2. The process claimed in claim 1, wherein the nickel germanosilicide comprises nickel monosilicide.

3. The process claimed in claim 1, further comprising removing nickel not consumed by formation of said nickel germanosilicide.

4. The process claimed in claim 1, wherein the thermal treatment is performed at a temperature between 350 degrees C. to 700 degrees C.

5. The process claimed in claim 1, wherein the polysilicon and polycrystalline silicon germanium are formed in situ.

6. The process claimed in claim 1, wherein the polycrystalline silicon germanium layer has a composition $Si_{1-x}Ge_x$ where x is in the range of 0.1 to 0.3.

7. The process claimed in claim 6, wherein x is approximately 0.2.

8. The process claimed in claim 1, wherein forming a layer of nickel is preceded by:

implanting shallow source and drain extensions;

forming a spacer around the gate; and implanting deep source and drain regions.

9. The process claimed in claim 8, wherein depositing said nickel is preceded by forming a protective layer over said gate and said source and drain regions.

10. A metal oxide semiconductor field effect transistor (MOSFET) device, comprising:

a semiconductor substrate comprising a layer of silicon germanium;

source and drain regions formed in the silicon germanium layer;

a strained silicon channel region formed on the silicon germanium layer and extending between the source and drain regions;

a gate insulator overlying the channel region; and nickel germanosilicide contacts formed on the silicon germanium source and drain regions.

11. The device claimed in claim 10, wherein the nickel germanosilicide comprises nickel monosilicide.

12. The device claimed in claim 10, wherein the polycrystalline silicon germanium layer has a composition $Si_{1-x}Ge_x$ where x is in the range of 0.1 to 0.3.

13. The device claimed in claim 12, wherein x is approximately 0.2.

14. The device claimed in claim 10, further comprising a polycide gate overlying the gate insulator, the polycide gate comprising a lower polysilicon portion and an upper polycrystalline silicon germanium portion, and a nickel germanosilicide contact formed on the upper polycrystalline silicon germanium portion of the gate.

15. The device claimed in claim 10, further comprising:
   a protective spacer formed on sidewalls of the polycide gate; and
   shallow source and drain extensions that extend beneath the spacer.

16. The device claimed in claim 15, further comprising a protective layer formed over said gate and said source and drain regions, and
   wherein the nickel germanosilicide contacts formed on the silicon germanium source and drain regions extend through the protective layer to said source and drain regions.

17. The device claimed in claim 10, wherein the source and drain regions and the channel region comprise a semiconductor body formed on an insulating layer to thereby comprise a silicon on insulator (SOI) MOSFET.

18. A process for forming a metal oxide semiconductor field effect transistor (MOSFET), comprising:
   providing a s miconductor comprising a layer of silicon germanium, a surface layer of strained silicon overlying the layer of silicon germanium, a gate insulating layer formed on the strained silicon, and a gate conductive layer formed on the gate insulating layer;
   patterning the gate conductive layer to form a gat overlying the gate insulating layer;
   removing the strained silicon layer from source and drain regions of the MOSFET to form a strained silicon channel region of the MOSFET,
   forming a layer of nickel in contact with the silicon germanium layer in the source and drain regions; and
   performing thermal treatment to form nickel germanosilicide contacts on the silicon germanium source and drain regions.

19. The process claimed in claim 18, wherein the nickel germanosilicide comprises nickel monosilicide.

20. The process claimed in claim 18, further comprising removing nickel not consumed by formation of said nickel germanosilicide.

21. The process claimed in claim 18, wherein the thermal treatment is performed at a temperature between 350 degrees C. to 700 degrees C.

* * * * *